(12) United States Patent
Liu et al.

(10) Patent No.: US 9,748,474 B2
(45) Date of Patent: Aug. 29, 2017

(54) NANO-SCALE ELECTRICAL CONTACTS, MEMORY DEVICES INCLUDING NANO-SCALE ELECTRICAL CONTACTS, AND RELATED STRUCTURES AND DEVICES

(71) Applicant: Micron Technology, Inc., Boise, ID (US)

(72) Inventors: Jun Liu, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/524,322

(22) Filed: Oct. 27, 2014

(65) Prior Publication Data
US 2015/0041753 A1 Feb. 12, 2015

Related U.S. Application Data

(62) Division of application No. 13/547,228, filed on Jul. 12, 2012, now Pat. No. 8,877,628.

(51) Int. Cl.
*H01L 47/00* (2006.01)
*H01L 45/00* (2006.01)
(Continued)

(52) U.S. Cl.
CPC .......... *H01L 45/06* (2013.01); *H01L 21/0337* (2013.01); *H01L 21/76807* (2013.01);
(Continued)

(58) Field of Classification Search
CPC .......... H01L 27/2472; H01L 21/76816; H01L 21/0337; H01L 21/76807; H01L 45/1233;
(Continued)

(56) References Cited

U.S. PATENT DOCUMENTS 5,831,276 A * 11/1998 Gonzalez ................ H01L 27/24
257/3
6,597,009 B2 7/2003 Wicker
(Continued)

OTHER PUBLICATIONS

Im et al., A Unified 7.5nm Dash-Type Confined Cell for High Performance PRAM Device, In Proc. Int'l. Electron Devices Meeting (IEDM) 2008, pp. 211-214 (2008).

*Primary Examiner* — Thinh T Nguyen
(74) *Attorney, Agent, or Firm* — TraskBritt

(57) ABSTRACT

Electrical contacts may be formed by forming dielectric liners along sidewalls of a dielectric structure, forming sacrificial liners over and transverse to the dielectric liners along sidewalls of a sacrificial structure, selectively removing portions of the dielectric liners at intersections of the dielectric liners and sacrificial liners to form pores, and at least partially filling the pores with a conductive material. Nano-scale pores may be formed by similar methods. Bottom electrodes may be formed and electrical contacts may be structurally and electrically coupled to the bottom electrodes to form memory devices. Nano-scale electrical contacts may have a rectangular cross-section of a first width and a second width, each width less than about 20 nm. Memory devices may include bottom electrodes, electrical contacts having a cross-sectional area less than about 150 nm$^2$ over and electrically coupled to the bottom electrodes, and a cell material over the electrical contacts.

17 Claims, 9 Drawing Sheets

(51) Int. Cl.
  *H01L 21/033* (2006.01)
  *H01L 21/768* (2006.01)
  *H01L 27/24* (2006.01)

(52) U.S. Cl.
  CPC .... *H01L 21/76816* (2013.01); *H01L 27/2472* (2013.01); *H01L 45/04* (2013.01); *H01L 45/126* (2013.01); *H01L 45/1233* (2013.01); *H01L 45/1253* (2013.01); *H01L 45/1273* (2013.01); *H01L 45/14* (2013.01); *H01L 45/146* (2013.01); *H01L 45/147* (2013.01); *H01L 45/16* (2013.01); *H01L 2924/0002* (2013.01)

(58) Field of Classification Search
  CPC ... H01L 45/1253; H01L 45/126; H01L 45/14; H01L 45/146; H01L 45/147; H01L 45/04; H01L 45/1237; H01L 2924/002
  USPC ....... 257/774, 773, 758, 4, E23.01, E21.241, 257/E21.577; 438/598, 763, 381, 382, 438/629, 637
  See application file for complete search history.

(56) References Cited

U.S. PATENT DOCUMENTS

| | | |
|---|---|---|
| 7,687,377 B2 | 3/2010 | Chen |
| 7,696,077 B2 | 4/2010 | Liu |
| 7,759,867 B2 | 7/2010 | Kim et al. |
| 7,859,036 B2 | 12/2010 | Liu et al. |
| 7,964,863 B2 | 6/2011 | Lung |
| 8,030,636 B2 | 10/2011 | Liu |
| 8,076,663 B2 | 12/2011 | Liu |
| 8,138,028 B2 | 3/2012 | Lung et al. |
| 2006/0091476 A1* | 5/2006 | Pinnow ............... H01L 21/0332 257/379 |
| 2006/0266991 A1 | 11/2006 | Chang et al. |
| 2008/0012147 A1* | 1/2008 | Watanabe ............. H01L 23/522 257/774 |
| 2008/0102401 A1* | 5/2008 | Chen ..................... G03F 7/0758 430/270.1 |
| 2009/0147564 A1* | 6/2009 | Lung ................... H01L 27/2436 365/163 |
| 2009/0189139 A1* | 7/2009 | Schrott ................... H01L 45/06 257/3 |
| 2010/0019221 A1* | 1/2010 | Lung ....................... H01L 45/04 257/5 |
| 2010/0048020 A1* | 2/2010 | Schrott ............... H01L 27/2409 438/692 |
| 2010/0081282 A1* | 4/2010 | Chou .................. H01L 21/0273 438/694 |
| 2010/0123542 A1 | 5/2010 | Vaithyanathan et al. |
| 2010/0276654 A1* | 11/2010 | Chen ....................... H01L 45/06 257/2 |
| 2011/0112083 A1 | 5/2011 | Song et al. |
| 2011/0186799 A1 | 8/2011 | Kai et al. |
| 2012/0018693 A1* | 1/2012 | Kraus ..................... H01L 45/06 257/2 |
| 2012/0223317 A1* | 9/2012 | Bahl .................. H01L 29/4175 257/76 |
| 2014/0015143 A1 | 1/2014 | Liu et al. |

* cited by examiner

US 9,748,474 B2

NANO-SCALE ELECTRICAL CONTACTS, MEMORY DEVICES INCLUDING NANO-SCALE ELECTRICAL CONTACTS, AND RELATED STRUCTURES AND DEVICES

CROSS-REFERENCE TO RELATED APPLICATION

This application is a divisional of U.S. patent application Ser. No. 13/547,228, filed Jul. 12, 2012, now U.S. Pat. No. 8,877,628, issued Nov. 4, 2014, the disclosure of which is hereby incorporated herein in its entirety by this reference.

TECHNICAL FIELD

Embodiments of the present disclosure relate to methods of forming pores and electrical contacts at a nano-scale (i.e., less than about 20 nm), as well as pores, electrical contacts, and memory devices formed by such methods.

BACKGROUND

Semiconductor structures are structures that are used or formed in the fabrication of semiconductor devices. Semiconductor devices include, for example, electronic signal processors, electronic memory devices, photoactive devices, and microelectromechanical (MEM) devices. Such structures and materials often include one or more semiconductor materials (e.g., silicon, germanium, a III-V semiconductor material, etc.), and may include at least a portion of an integrated circuit.

There are many types of electronic memory devices being used or under development. For example, dynamic random-access memory (DRAM) and NAND Flash memory have been used for many years. Other memory types, often referred to as "emerging memory," are currently under development and may replace or supplement DRAM and NAND Flash memories as they become technologically and economically feasible. Some example emerging memory types include resistive random-access memory (RRAM), phase change memory (PCM), and magnetoresistive random-access memory (MRAM).

Some emerging memory types require relatively high electrical current density (measured in amperes per unit area) to properly write, read, and/or erase data to memory cells thereof. The relatively high electrical current density requires a relatively large amount of electrical current for proper operation. In addition, the large amount of current requires memory cell access devices (e.g., transistors, diodes) to be formed of a sufficient size to handle such electrical currents without failure.

In one known PCM configuration, an electrical contact having a thickness of about 7.5 nm is formed by depositing a metal on a sidewall of a structure. The metal is then patterned by photolithography techniques to form the electrical contact having a cross-section of about 7.5 nm (defined by the thickness of the metal) by about 22 nm (defined by the photolithography). A top portion of the electrical contact is recessed, and PCM cell material is introduced into the recess using a chemical vapor deposition (CVD) process.

BRIEF DESCRIPTION OF THE DRAWINGS

FIGS. 1A through 7C illustrate a method of forming a pore, an electrical contact, and a memory device according to embodiments of the present disclosure.

FIG. 1A illustrates a top view of a semiconductor structure according to an embodiment of the present disclosure, the semiconductor structure including a dielectric material, bottom electrodes formed in the dielectric material, a first dielectric structure formed over the dielectric material and over portions of the bottom electrodes, and a first liner formed along sidewalls of the first dielectric structure.

FIG. 7C illustrates a cross-sectional side view of the semiconductor structure of FIG. 7A taken at section line 7C-7C of FIG. 7A.

DETAILED DESCRIPTION

Figure 1A:
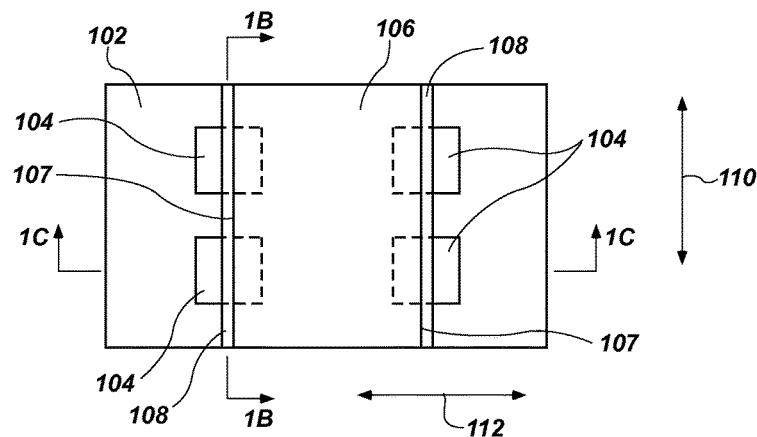

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the semiconductor industry.

In addition, the description provided below does not describe a complete process flow for forming memory devices. The methods described below do not necessarily form complete semiconductor devices. The remainder of the process flow and memory devices are known to those of ordinary skill in the art. Accordingly, only the methods and devices necessary to understand embodiments of the present disclosure are described in detail herein. Additional acts to form complete memory devices and systems may be performed by conventional fabrication techniques known to those of ordinary skill in the art.

As used herein, any relational term, such as "first," "second," "over," "underlying," "horizontal," "vertical," etc., is used for clarity and convenience in understanding the present disclosure and accompanying drawings and does not connote or depend on any specific preference, orientation, or order, except where the context clearly indicates otherwise.

As used herein, the term "substantially," with reference to a given parameter, property, or condition, means and includes to a degree that one of ordinary skill in the art would understand that the given parameter, property, or condition is met within a degree of variance, such as within acceptable manufacturing tolerances.

As used herein, the phrase "cross-section," with reference to an electrically conductive structure (e.g., an electrical contact), means and includes a section taken substantially perpendicular to an average electrical current flow through the electrically conductive structure during operation thereof.

As used herein, the term "nano-scale" means and includes at a scale below conventional photolithographic resolution limits. For example, a nano-scale structure may have at least one dimension less than about 20 nm. In some embodiments, the nano-scale structure may have at least one dimension that is less than about 10 nm. In some embodiments, the nano-scale structure may have cross-sectional dimensions in two transverse (e.g., perpendicular) directions less than about 20 nm each, or less than about 10 nm each.

In the following detailed description, reference is made to the accompanying drawings, which form a part of the present disclosure, and in which is shown, by way of illustration, specific embodiments in which the present disclosure may be practiced. These embodiments are described in sufficient detail to enable a person of ordinary skill in the art to practice the present disclosure. However, other embodiments may be utilized and structural and compositional changes may be made without departing from the scope of the present disclosure. The illustrations presented herein are not meant to be actual views of any particular system, device, or structure, but are merely idealized representations that are employed to describe the embodiments of the present disclosure. The drawings presented herein are not necessarily drawn to scale. Additionally, elements common or similar between drawings may retain the same numerical designation.

The embodiments of the present disclosure include methods of forming nano-scale pores, methods of forming nano-scale electrical contacts, and methods of forming memory devices and systems including such nano-scale pores and/or electrical contacts. The embodiments of the present disclosure also include nano-scale pores, nano-scale electrical contacts, memory devices, and systems formed by such methods. The nano-scale pores and electrical contacts of the present disclosure may have one or more cross-sectional dimensions below conventional photolithography resolution limits. In some embodiments, the nano-scale pores and electrical contacts may have two cross-sectional dimensions in two transverse (e.g., perpendicular) dimensions that each have a nano-scale value. Such nano-scale electrical contacts, when used in memory devices, may effectively reduce the amount of electrical current utilized to maintain a particular current density, and may enable smaller access devices to be used.

FIG. 1A through 7C illustrate a method of forming pores, electrical contacts, and memory devices in accordance with embodiments of the present disclosure. Such methods may be used to form apparatuses (e.g., memory devices and systems, devices and systems including such memory devices, etc.) including nano-scale electrical contacts. Although the drawings of the present disclosure illustrate forming electrical contacts configured to electrically couple bottom electrodes to cell material of a memory device (e.g., a phase change memory (PCM) device or a resistive random-access memory (RRAM) device, etc.), such an application is presented by way of example only. Indeed, the methods and structures of the present disclosure may be used in any application where a small (e.g., nano-scale) electrical contact or other structure is desired or even in applications where a relatively larger electrical contact or other structure is desired.

Figure 1B:
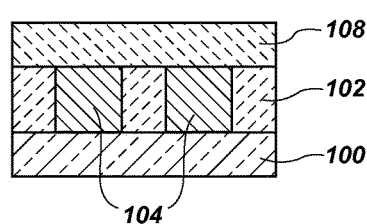
FIG. 1B illustrates a cross-sectional side view of the semiconductor structure of FIG. 1A taken at section line 1B-1B of FIG. 1A, further showing a substrate over which the dielectric material is formed.
Figure 1C:
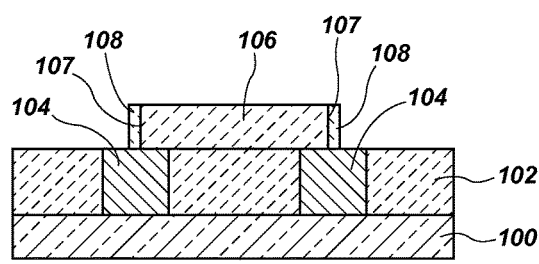
FIG. 1C illustrates a cross-sectional side view of the semiconductor structure of FIG. 1A taken at section line 1C-1C of FIG. 1A.

FIGS. 1A through 1C illustrate various views of a semiconductor structure that includes a substrate 100, a dielectric material 102 over the substrate 100, bottom electrodes 104 over the substrate 100 and in the dielectric material 102, a dielectric structure 106 over portions of the dielectric material 102 and optionally over portions of the bottom electrodes 104, and dielectric liners 108 along sidewalls 107 of the dielectric structure 106. Portions of the bottom electrodes 104 underlying the dielectric structure 106 and the dielectric liners 108 are shown by dashed lines in FIG. 1A. The substrate 100 may comprise a semiconductor material, such as silicon, germanium, a III-V semiconductor material, etc. Although not shown for simplicity, electrical features, such as access devices (e.g., transistors, diodes, etc.), electrically conductive lines (e.g., digit lines, etc.), and electrically conductive vias, may be formed in, on, above, or below the substrate 100. The electrical features may be formed in the substrate 100 by conventional methods. However, in some embodiments, the physical size of one or more of the electrical features, such as the size of the access devices, may be reduced compared to conventional configurations due to a relatively lower electrical current required to effectively operate memory cells to be formed including a smaller electrical contact size, as will be described in more detail below. In addition, a density of the access devices (i.e., a number of access devices per unit area) may be increased due to the reduced size of each access device.

To form the semiconductor structure, a dielectric material 102 may be disposed over the substrate 100. By way of non-limiting example, the dielectric material 102 may comprise a silicon oxide material (e.g., $SiO_2$) formed over the substrate 100 by one or more of a spin-coating operation, a chemical vapor deposition (CVD) operation, depositing the $SiO_2$ from a tetraethylorthosilicate (TEOS) precursor (i.e., a TEOS operation), and an atomic layer deposition (ALD) operation, for example.

The bottom electrodes 104 may be formed over the substrate 100 and in the dielectric material 102. Each bottom electrode 104 may be in electrical contact with an access device (not shown) of the substrate 100, either directly or indirectly (i.e., through another electrically conductive feature). The bottom electrodes 104 may be formed by selectively removing material from the dielectric material 102 and by forming a conductive material in the area where material was removed. Material may be removed from the dielectric material 102 using conventional material removal techniques, such as by photolithographic masking and etching operations, as will be understood by one of ordinary skill in the art. In such embodiments, a mask (not shown) having a desired pattern may be formed over the dielectric material 102, which is exposed and developed to form apertures in locations where the bottom electrodes 104 are to be formed. Portions of the dielectric material 102 that are exposed may be removed using an etching operation, such as a dry (i.e., reactive ion) etching operation or a wet (i.e., chemical) etching operation, to form holes in the dielectric material. After the holes are at least partially formed, the mask may be removed. The holes may be filled with an electrically conductive material to form the bottom electrodes 104 by conventional material formation techniques, as will be understood by one of ordinary skill in the art. Conductive material may be formed in the holes using one or more of an electroless plating operation, an electrolytic plating operation, an ALD operation, a CVD operation, a physical vapor deposition (PVD) operation, and a sputtering operation, for example. The conductive material of the bottom electrodes 104 may be selected to exhibit a high electrical conductivity. For example, the bottom electrodes 104 may comprise one or more of tungsten, titanium, aluminum, copper, cobalt, and alloys of such materials.

If conductive material used to form the bottom electrodes 104 is formed over an upper surface of the dielectric material 102 when viewed in the perspective of FIGS. 1B and 1C), the conductive material may be removed from the upper surface of the dielectric material 102. By way of example and not limitation, one or more of an etching operation, a grinding operation, and a polishing operation (e.g., a chemical-mechanical polishing (CMP) operation) may be used to remove the conductive material from the upper surface of the dielectric material 102. Such material removal operations may physically and electrically isolate adjacent bottom electrodes 104 from each other.

Although the bottom electrodes 104 are shown in FIG. 1A as being substantially square in cross-section, the present disclosure is not limited by the shape of the bottom electrodes 104. For example, in some embodiments, the bottom electrodes 104 may have a cross-section that is generally circular, rectangular, polygonal, or irregular.

After the bottom electrodes 104 are formed over the substrate 100 and through the dielectric material 102, the dielectric structure 106 may be formed over the dielectric material 102 and, optionally, over portions of the bottom electrodes 104, as shown in FIGS. 1A and 1C. The material of the dielectric structure 106 may be the same or a different material compared to the dielectric material 102, and may be formed over the dielectric material 102 by one or more of a spin-coating operation, a CVD operation, a TEOS operation, and an ALD operation, for example. By way of example and not limitation, the dielectric structure 106 may be formed from one or more of a silicon oxide material, a silicon carbide material, a hafnium oxide material, an aluminum oxide material, and a zirconium oxide material, for example. The dielectric structure 106 may be in the form of a line or stripe of dielectric material longitudinally extending in a first direction 110. A lateral width of the dielectric structure 106 in a second direction 112 transverse (e.g., perpendicular) to the first direction 110 may, optionally, be selected to dispose the dielectric structure 106 over portions of adjacent bottom electrodes 104. The lateral width of the dielectric structure 106 may define locations where electrical contacts are to be formed over the bottom electrodes 104, as will be explained in more detail below. Accordingly, the dielectric structure 106 may have sidewalls 107 positioned proximate locations where electrical contacts are to be formed over the bottom electrodes 104. The dielectric structure 106 may be formed by depositing a material over the dielectric material 102 and bottom electrodes 104 and removing portions of the material that do not define the dielectric structure 106. Material may be removed by conventional material removal techniques, such as by one or more photolithographic masking and etching operations similar to those described above, to form the dielectric structure 106 shown in FIGS. 1A and 1C.

The dielectric liners 108 may be formed along the sidewalk 107 of the dielectric structure 106. A dielectric material having etch selectivity with respect to the dielectric structure 106 and/or the dielectric material 102 may be deposited over the dielectric structure 106 and over exposed portions of the dielectric material 102 and bottom electrodes 104. By way of example and not limitation, the dielectric liners 108 may be formed of one or more of a nitride material and an oxide material. For example, the dielectric liners 108 may be formed of one or more of silicon nitride, aluminum oxide, hafnium silicate, zirconium silicate, hafnium oxide, and zirconium oxide. A conformal deposition technique may be used to dispose the dielectric liners 108 along the sidewalk 107 of the dielectric structure 106. By way of example and not limitation, a CVD operation (e.g., a metallorganic CVD (MOCVD) operation) or an ALD operation may be used. Material of the dielectric liners 108 not disposed along the sidewalls 107 may be removed by an anisotropic material removal operation, such as by an anisotropic dry reactive ion etching operation. Thus, material of the dielectric liners 108 may be removed from over horizontal (when viewed from the perspective of FIGS. 1B and 1C) surfaces of the dielectric material 102, the bottom electrodes 104, and the dielectric structure 106, while material may remain along the vertical (when viewed from the perspective of FIG. 1C) sidewalls 107 of the dielectric structure 106 to define the dielectric liner 108.

A thickness of the dielectric liners 108 in the second direction 112 may ultimately define one dimension of an electrical contact to be formed over the bottom electrodes 104, as will be explained in more detail below. Accordingly, the thickness of each dielectric liner 108 may be tailored to a desired electrical contact dimension. By way of example and not limitation, the dielectric liner 108 may be formed to have a nano-scale thickness, such as less than about 20 nm, to form a nano-scale electrical contact. In some embodiments, the dielectric liner 108 may have a thickness of less than about 10 nm. In some embodiments, the dielectric liner 108 may have a thickness of about 2 nm or less.

Figure 2A:
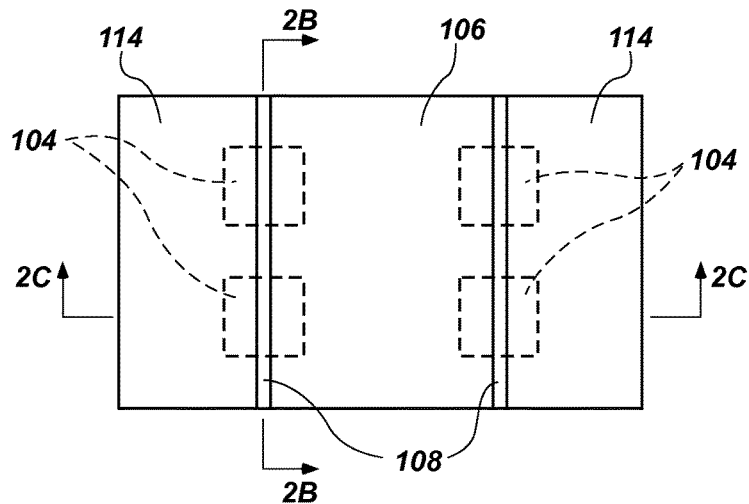
FIG. 2A illustrates a top view of the semiconductor structure of FIG. 1A after a first dielectric fill material has been formed over a surface thereof.
Figure 2B:
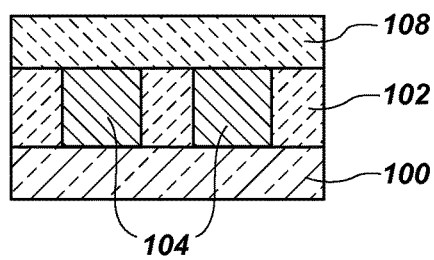
FIG. 2B illustrates a cross-sectional side view of the semiconductor structure of FIG. 2A taken at section line 2B-2B of FIG. 2A.
Figure 2C:
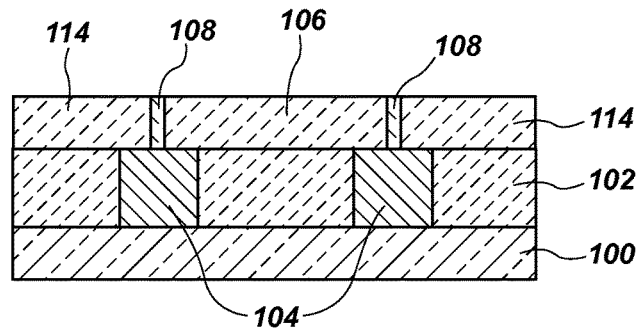
FIG. 2C illustrates a cross-sectional side view of the semiconductor structure of FIG. 2A taken at section line 2C-2C of FIG. 2A.

Referring to FIGS. 2A through 2C, a dielectric filler material 114 may be formed over portions of the dielectric material 102 and bottom electrodes 104 that are not covered by the dielectric structure 106 and dielectric liners 108. In other words, the dielectric filler material 114 may be formed adjacent to the dielectric liners 108. In some embodiments, the dielectric filler material 114 may be the same as the material of the dielectric structure 106. The dielectric filler material 114 may be formed by one or more of a spin-coating operation, a CVD operation, a TEOS operation, and an ALD operation, for example. An upper surface (when viewed from the perspective of FIG. 2C) of the dielectric filler material 114, and optionally upper surfaces of the dielectric structure 106 and the dielectric liners 108, may be planarized by, for example, by one or more of an etching operation, a grinding operation, and a polishing operation (e.g., a CMP operation). The planarization of the dielectric filler material 114 may also remove any material over the dielectric liner 108 to expose the upper surface of the dielectric liners 108.

Figure 3A:
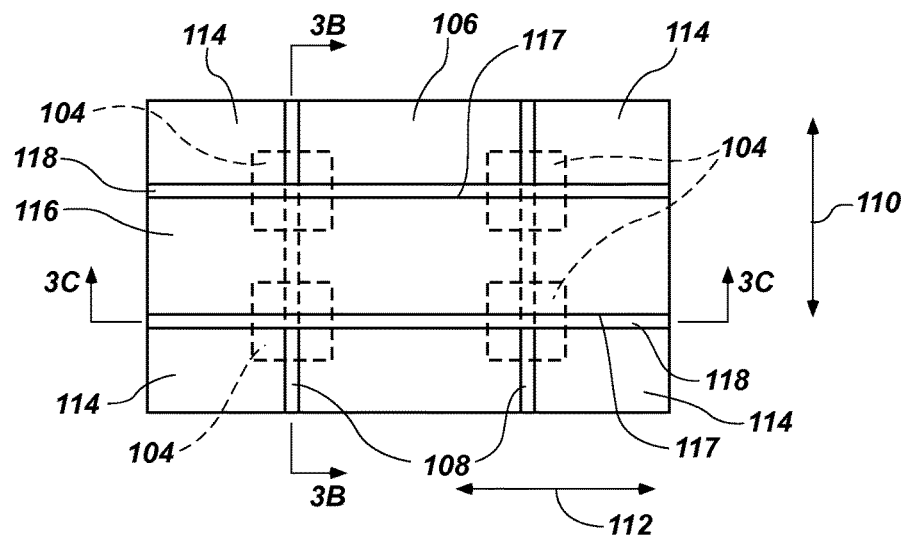
FIG. 3A illustrates a top view of the semiconductor structure of FIG. 2A after a second dielectric structure has been formed over a surface thereof and a second liner has been formed along sidewalls of the second dielectric structure.
Figure 3B:
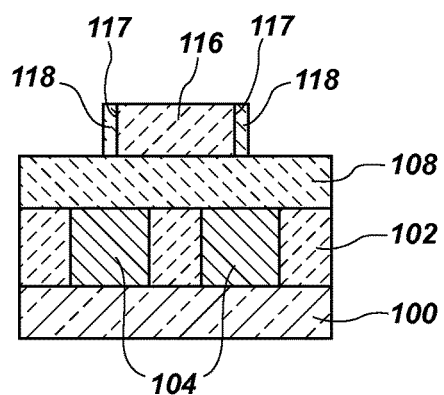
FIG. 3B illustrates a cross-sectional side view of the semiconductor structure of FIG. 3A taken at section line 3B-3B of FIG. 3A.
Figure 3C:
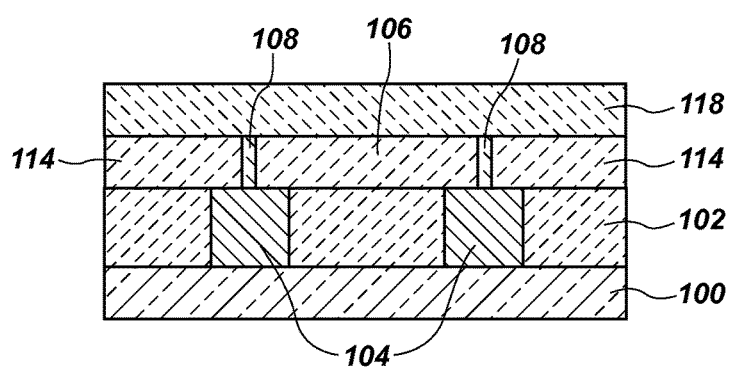
FIG. 3C illustrates a cross-sectional side view of the semiconductor structure of FIG. 3A taken at section line 3C-3C of FIG. 3A.

Referring to FIGS. 3A through 3C, a sacrificial structure 116 and sacrificial liners 118 may be formed to longitudinally extend in the second direction 112 (i.e., transverse to the first direction 110 in which the dielectric structure 106 longitudinally extends) over portions of the dielectric structure 106, the dielectric liners 108, and the dielectric filler material 114. The sacrificial structure 116 and the sacrificial liners 118 are referred to as "sacrificial" because the sacrificial structure 116 and the sacrificial liners 118 may be removed in a subsequent operation, as will be explained in more detail below.

As described above with reference to the dielectric structure 106, a lateral width of the sacrificial structure 116 in the first direction 110 may, optionally, be selected to dispose the sacrificial structure 116 over portions of adjacent bottom electrodes 104. The lateral width of the sacrificial structure 116 may define locations where electrical contacts are to be formed over the bottom electrodes 104, as will be explained in more detail below. Accordingly, the sacrificial structure 116 may have sidewalls 117 positioned proximate locations where electrical contacts are to be formed over the bottom electrodes 104. The sacrificial structure 116 may be formed by depositing a material over the dielectric structure 106, the dielectric liners 108, and the dielectric filler material 114 and removing portions of the material that do not define the sacrificial structure 116. Material may be removed by conventional material removal techniques, such as by one or more photolithographic masking and etching operations similar to those described above, to form the sacrificial structure 116 shown in FIGS. 3A and 3B.

The sacrificial liners 118 may be formed along the sidewalls 117 of the sacrificial structure 116. A material having etch selectivity with respect to the sacrificial structure 116, the dielectric structure 106, and/or the dielectric filler material 114 may be deposited over the sacrificial structure 116 and over exposed portions of the dielectric structure 106, the dielectric liners 108, and the dielectric filler material 114. The sacrificial liners 118 and the dielectric liners 108 may be located to define intersections between the sacrificial liners 118 and the dielectric liners 108 located over the bottom electrodes 104. The sacrificial liners 118 may be formed of the same or a different material compared to the dielectric liners 108, as long as each of the sacrificial liners 118 and the dielectric liners 108 is selectively removable with respect to the dielectric structure 106, dielectric filler material 114, sacrificial structure 116, and a subsequently formed sacrificial filler material 120 (described below with reference to FIGS. 4A through 4C). A conformal deposition technique may be used to dispose the sacrificial liners 118 along the sidewalls 117 of the sacrificial structure 116. By way of example and not limitation, a CVD operation (e.g., an MOCVD operation) or an ALD operation may be used. Material of the sacrificial liners 118 not disposed along the sidewalls 117 may be removed by an anisotropic material removal operation, such as by an anisotropic dry reactive ion etching operation. Thus, material of the sacrificial liners 118 may be removed from over horizontal (when viewed from the perspective of FIGS. 3B and 3C) surfaces of the dielectric structure 106, dielectric liners 108, dielectric filler material 114, and sacrificial structure 116, while material may remain along the vertical (when viewed from the perspective of FIG. 3B) sidewalls 117 of the sacrificial structure 116 to define the sacrificial liner 118.

A thickness of the sacrificial liners 118 taken in the first direction 110 may ultimately define one dimension of an electrical contact to be formed over the bottom electrodes 104, as will be explained in more detail below. Accordingly, the thickness of each sacrificial liner 118 may be tailored to a desired electrical contact dimension. By way of example and not limitation, the sacrificial liner 118 may be formed to have a nano-scale thickness, such as less than about 20 nm, to form a nano-scale electrical contact. In some embodiments, the sacrificial liner 118 may have a thickness of less than about 10 nm. In some embodiments, the sacrificial liner 118 may have a thickness of about 2 nm or less.

Figure 4A:
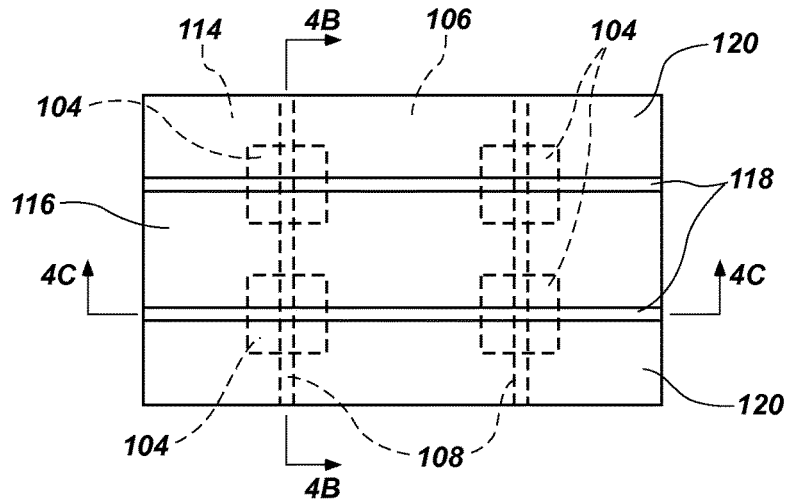
FIG. 4A illustrates a top view of the semiconductor structure of FIG. 3A after a second fill material has been formed over a surface thereof.
Figure 4B:
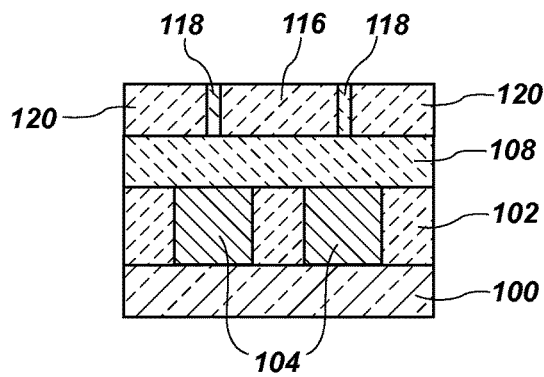
FIG. 4B illustrates a cross-sectional side view of the semiconductor structure of FIG. 4A taken at section line 4B-4B of FIG. 4A.
Figure 4C:
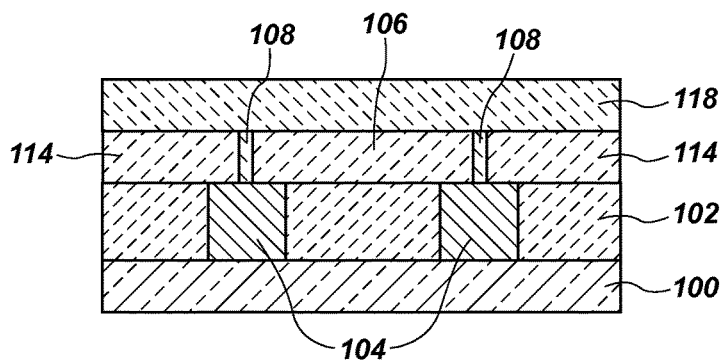
FIG. 4C illustrates a cross-sectional side view of the semiconductor structure of FIG. 4A taken at section line 4C-4C of FIG. 4A.

Referring to FIGS. 4A through 4C, a sacrificial filler material 120 may be formed over portions of the dielectric structure 106, dielectric liners 108, and dielectric filler material 114 that are not covered by the sacrificial structure 116 and sacrificial liners 118. In other words, the sacrificial filler material 120 may be formed adjacent to the sacrificial liners 118. The bottom electrodes 104, dielectric structure 106, dielectric liners 108, and dielectric filler material 114 are shown in dashed lines in FIG. 4A because each of these structures and materials is covered by the sacrificial structure 116, sacrificial liners 118, and sacrificial filler material 120 when viewed from the perspective of FIG. 4A. In some embodiments, the sacrificial filler material 120 may be the same as the material of the sacrificial structure 116. The sacrificial filler material 120 may be formed by one or more of a spin-coating operation, a CVD operation, a TEOS operation, and an ALD operation, for example. An upper surface (when viewed from the perspective of FIG. 4C) of the sacrificial filler material 120, and optionally upper surfaces of the sacrificial structure 116 and the sacrificial liners 118, may be planarized by, for example, one or more of an etching operation, a grinding operation, and a polishing operation (e.g., a CMP operation). The planarization of the sacrificial filler material 120 may also remove any material over the sacrificial liners 118 to expose the upper surface of the sacrificial liners 118.

Figure 5A:
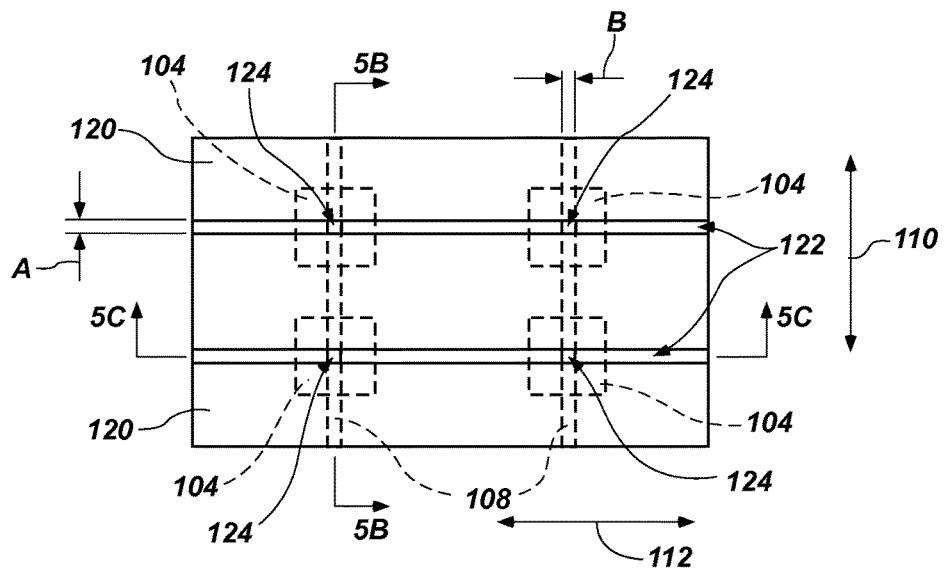
FIG. 5A illustrates a top view of the semiconductor structure of FIG. 4A after the second liner and portions of the first liner have been removed to form pores.
Figure 5B:
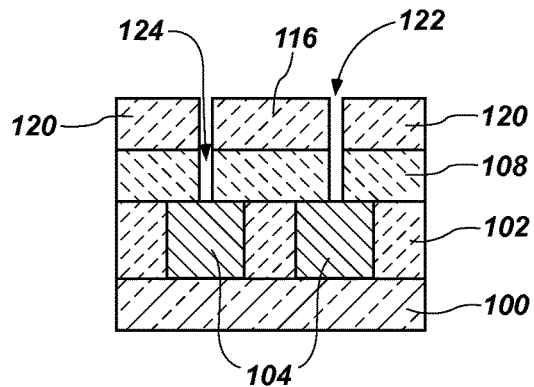
FIG. 5B illustrates a cross-sectional side view of the semiconductor structure of FIG. 5A taken at section line 5B-5B of FIG. 5A.
Figure 5C:
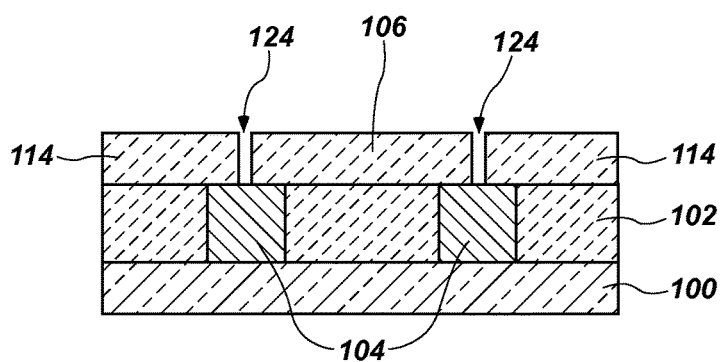
FIG. 5C illustrates a cross-sectional side view of the semiconductor structure of FIG. 5A taken at section line 5C-5C of FIG. 5A.

Referring to FIGS. 5A through 5C, in conjunction with FIGS. 4A through 4C, one or more material removal operations may be performed to remove the sacrificial liners 118 to form trenches 122 between the sacrificial structure 116 and the sacrificial filler material 120, and to remove portions of the dielectric liners 108 underlying the trenches 122 to form pores 124. The portions of the dielectric liners 108 to be removed may be defined by an intersection between the dielectric liners 108 and the sacrificial liners 118. By way of non-limiting example, the sacrificial liners 118 and portions of the dielectric liners 108 may be removed by one or more dry etch operations and/or wet etch operations. In embodiments where the dielectric liners 108 and the sacrificial liners 118 comprise the same material, or where the dielectric liners 108 and the sacrificial liners 118 are otherwise removable by a similar etch chemistry, a single material removal operation may be performed. Alternatively, two or more material removal operations may be used to sequentially remove the sacrificial liners 118 to form the trenches 122 and then remove the portions of the dielectric liners 108 underlying the trenches 122 to form the pores 124. After the pores 124 are formed using the one or more material removal operations, the bottom electrodes 104 may be exposed through the pores 124.

The lateral width of the trenches 122 in the first direction 110 may be ultimately defined by the thickness of the sacrificial liners 118 prior to removal thereof. Accordingly, the pores 124 formed through and underlying the trenches 122 may each have a first width A in the first direction 110 defined by the thickness of the sacrificial liners 118 prior to removal thereof. Similarly, the pores 124 may have a second width B in the second direction 112 ultimately defined by the thickness of the dielectric liners 108. Thus, as shown in FIG. 5A, the pores 124 may each have a generally rectangular (e.g., substantially square) cross-section of the first width A in the first direction 110 and of the second width B in the second direction 112. The first width A may be selected by forming the sacrificial liners 118 to have a desired thickness, as described above, of the first width A. The second width B may be independently selected by forming the dielectric liners 108 to have a desired thickness, as described above, of the second width B. Accordingly, a cross-sectional shape and size of the pores 124 may be tailored by selecting the thicknesses of the dielectric liners 108 and the sacrificial liners 118. Thus, the pores 124 may be formed independently of photolithography resolution limits. As described above, one or both of the dielectric liners 108 and the sacrificial liners 118 may have a nano-scale thickness. As a result, one or both of the first width A and the second width B may have a nano-scale value. By way of example and not limitation, one or both of the first width A and the second width B of the pores 124 may be less than about 20 nm. In some embodiments, one or both of the first width A and the second width B of the pores 124 may be less than about 10 nm. In some embodiments, one or both of the first width A and the second width B of the pores 124 may be about 2 nm or less.

Accordingly, the present disclosure includes methods of forming nano-scale pores. According to such methods, a first structure may be formed to longitudinally extend in a first direction. A first liner having a nano-scale thickness may be formed along a sidewall of the first structure, and a first filler material may be formed adjacent to the first liner. A second structure may be formed over the first structure, the first liner, and the first filler material, the second structure longitudinally extending in a second direction transverse to the first direction. The method may also include forming a second liner having a nano-scale thickness along a sidewall of the second structure and forming a second filler material adjacent to the second liner. The second liner may be removed to form a trench between the second structure and the second filler material. A portion of the first liner exposed through the trench may be removed to form a nano-scale pore.

Figure 6A:
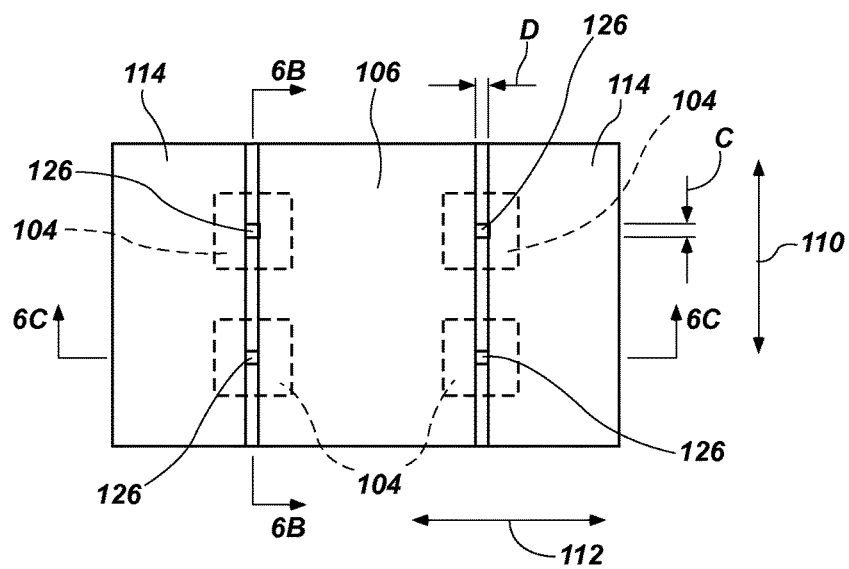
FIG. 6A illustrates a top view of the semiconductor structure of FIG. 5A after the pores have been filled with a conductive material to form electrical contacts.
Figure 6B:
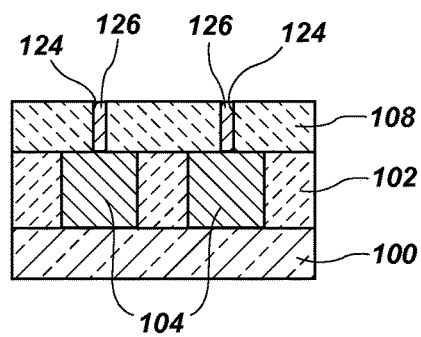
FIG. 6B illustrates a cross-sectional side view of the semiconductor structure of FIG. 6A taken at section line 6B-6B of FIG. 6A.
Figure 6C:
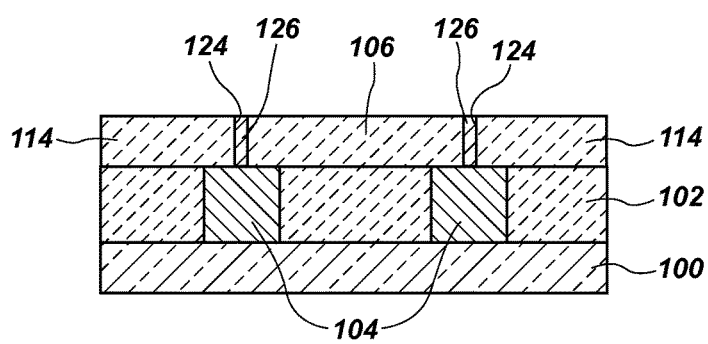
FIG. 6C illustrates a cross-sectional side view of the semiconductor structure of FIG. 6A taken at section line 6C-6C of FIG. 6A.

Referring to FIGS. 6A through 6C, in conjunction with FIGS. 5A through 5C, the pores 124, and optionally the trenches 122, may be at least partially filled with a conductive material, such as one or more of tungsten, titanium, aluminum, copper, cobalt, and alloys of such materials, for example. By way of example and not limitation, the pores 124 and the trenches 122 may be filled with a conductive material by at least one of an electroless plating operation, an electrolytic plating operation, an ALD operation, a CVD operation, a PVD operation, and a sputtering operation. A multi-step operation may be used, such as forming a seed layer then growing another conductive material on the seed layer. The conductive material may be electrically coupled with the bottom electrodes 104 at the bottom of each pore 124.

After the pores 124 are sufficiently filled with a conductive material, the sacrificial structure 116, sacrificial filler material 120, and conductive material in the trenches 122 may be removed, such that the conductive material remains in the pores 124 to form electrical contacts 126. The sacrificial structure 116, sacrificial filler material 120, and conductive material in the trenches 122 may be removed by one or more material removal operations, such as, for example, a chemical etching operation, a grinding operation, and a polishing operation (e.g., a CMP operation). In some embodiments, one or more of the dielectric structure 106, remaining portions of the dielectric liner 108, dielectric filler material 114, and bottom electrodes 104 may function as an etch-stop material or CMP-stop material to assist in controlling the depth at which material is removed. Alternatively, or in addition, a separate etch-stop layer or a separate CMP-stop layer (not shown) may have been previously formed over the dielectric structure 106, the dielectric liner 108, and/or the dielectric filler material 114. Other methods of removing material to a desired depth that may be used in the formation of the electrical contacts 126 are known and, therefore, are not described in detail in the present disclosure.

The electrical contacts 126 may each have a cross-section ultimately defined by an intersection between the dielectric liner 108 and the sacrificial liner 118 (FIGS. 3A and 4A). Accordingly, a first width C of each electrical contact 126 in the first direction 110 may be ultimately defined by the thickness of the sacrificial liners 118 prior to removal thereof. Similarly, the electrical contacts 126 may each have a second width D in the second direction 112 ultimately defined by the thickness of the dielectric liners 108. Thus, as shown in FIG. 6A, the electrical contacts 126 may each have a generally rectangular (e.g., substantially square) cross-section of the first width C in the first direction 110 and of the second width D in the second direction 112. The first width C may be selected by forming the sacrificial liners 118 to have a desired thickness, as described above, of the first width C. The second width D may be independently selected by forming the dielectric liners 108 to have a desired thickness, as described above, of the second width D. Accordingly, a cross-sectional shape and size of each electrical contact 126 may be tailored by selecting the thicknesses of the dielectric liners 108 and the sacrificial liners 118. As described above, one or both of the dielectric liners 108 and the sacrificial liners 118 may have a nano-scale thickness. As a result, one or both of the first width C and the second width D may have a nano-scale value. By way of example and not limitation, one or both of the first width C and the second width D of the electrical contacts 126 may be less than about 20 nm. In some embodiments, one or both of the first width C and the second width of the electrical contacts 126 may be less than about 10 nm. In some embodiments, one or both of the first width C and the second width D of the electrical contacts 126 may be about 2 nm or less. Alignment of the electrical contacts 126 having such nano-scale widths to the underlying bottom electrodes 104 may be simplified due to a greater margin around the electrical contacts 126 in both the first direction 110 and the second direction 112 compared to electrical contacts that are not nano-scale in the first direction 110 and the second direction 112.

By selecting the first width C and the second width D, a desired cross-sectional area of each of the electrical contact 126 may be obtained. The cross-sectional area may, in some embodiments, be smaller than is currently obtainable through conventional photolithographic techniques. The electrical contacts 126 may each have a cross-sectional area of less than about 150 nm$^2$, less than about 100 nm$^2$, less than about 50 nm$^2$, or less than about 10 nm$^2$, for example. Thus, the cross-sectional area of each of the electrical contacts 126 is determined by the thicknesses of the dielectric liners 108 and the sacrificial liners 118. In some embodiments, the cross-sectional area of the electrical contact 126 may be about 4 nm$^2$. Certain memory types require a minimum current density, expressed in amperes per unit of area (e.g., amperes per square meter), to function properly. Reducing the area through which current flows, such as by reducing the cross-sectional area of the electrical contacts 126, may enable the current flowing through each memory cell to be proportionally reduced. Therefore, overall current requirements and power consumption can likewise be reduced for a given number of memory cells formed with the relatively smaller electrical contacts 126.

In addition to enabling the formation of relatively smaller electrical contacts 126 than is possible through conventional photolithography, controllability and uniformity of the electrical contacts 126 may be improved compared to structures formed by conventional photolithography. For example, when conventional photolithography is used to form structures that approach, reach, or exceed the resolution limits of conventional photolithography, there may be a relatively high variability in the dimensions thereof. However, in the present disclosure, the dimensions of the electrical contacts 126 may be ultimately dependent on the film thickness of the dielectric liners 108 and of the sacrificial liners 118. Film thicknesses are more easily controllable (i.e., may exhibit less variability) at sizes near photolithographic resolution limits compared to feature dimensions formed using conventional photolithography. Accordingly, the methods of the present disclosure may be used to form electrical contacts 126 that are both more uniform and smaller compared to electrical contacts formed by conventional photolithography. These improvements can be realized in dimensions of the electrical contacts 126 in both the first direction 110 and the second direction 112.

Accordingly, a method of forming electrical contacts of the present disclosure may include forming dielectric liners along sidewalls of a dielectric structure, forming sacrificial liners over and transverse to the dielectric liners along sidewalls of a sacrificial structure to define intersections where the sacrificial liners cross the dielectric liners, selectively removing portions of the dielectric liners at the intersections to form pores, and at least partially filling the pores with a conductive material to form electrical contacts.

One or both of the dielectric liners and the sacrificial liners may be formed to have nano-scale thicknesses.

Figure 7A:
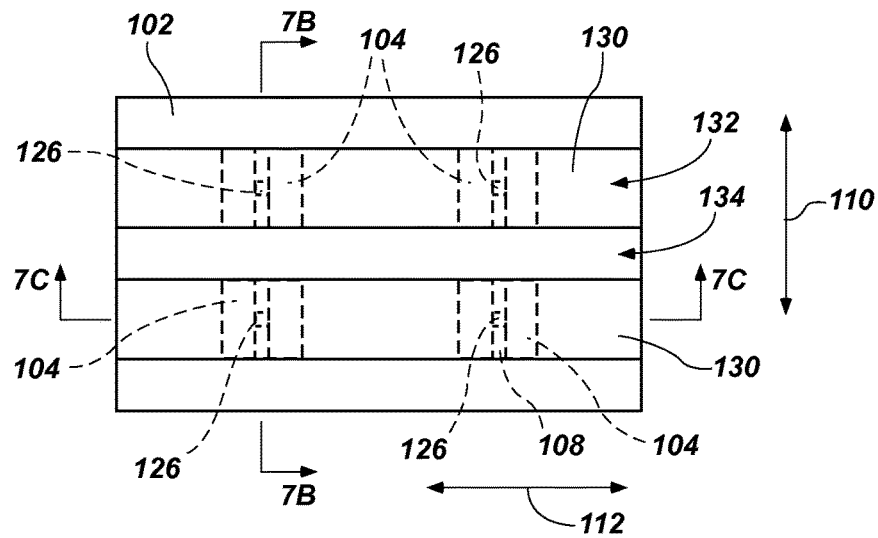
FIG. 7A illustrates a top view of the semiconductor structure of FIG. 6A after cell material and top electrodes have been formed and patterned over the electrical contacts.
Figure 7B:
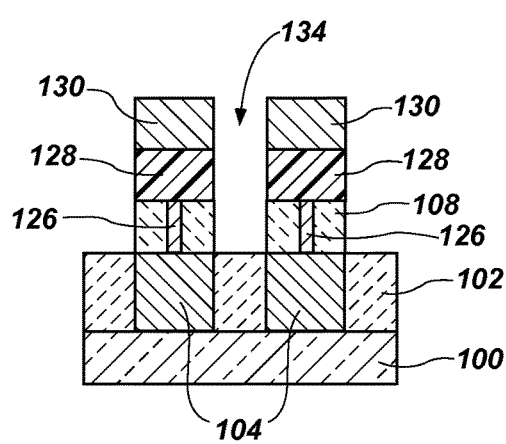
FIG. 7B illustrates a cross-sectional side view of the semiconductor structure of FIG. 7A taken at section line 7B-7B of FIG. 7A.
Figure 7C:
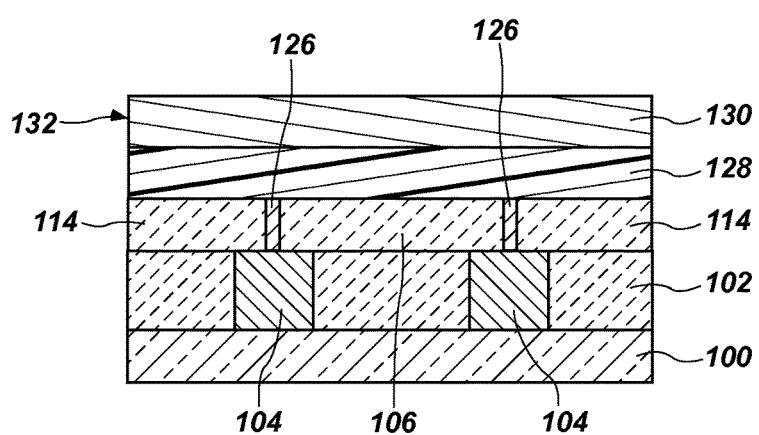

Referring to FIGS. 7A through 7C, a cell material 128 and top electrodes 130 may be sequentially formed over the electrical contacts 126 to form a plurality of memory cells. The composition of the cell material 128 used to form the plurality of memory cells is dependent on the type of memory being formed. Some example memory types that may benefit from comprising the relatively small electrical contacts 126 of the present disclosure include: magnetoresistive random-access memory (MRAM), spin-transfer torque random-access memory (STT-RAM), phase change memory (PCM), conductive bridge RAM, and resistive random-access memory (RRAM). By way of example and not limitation, cell materials for RRAM may comprise one or more of: a mixture of copper and molybdenum oxide; titanium and so-called "PCMO" (a compound of praseodymium, calcium, manganese, and oxygen); gold or platinum and a mixture of niobium and strontium-titanium-oxide; strontium oxide and a mixture of niobium and strontium-titanium-oxide; iron oxide; tantalum oxide; vanadium oxide; silver and a compound of lanthanum, calcium, manganese, and oxygen; copper and a mixture of chromium and strontium zirconates; a chalcogenide material; and a perovskite material. The top electrodes 130 may comprise an electrically conductive material, such as one or more of tungsten, titanium, aluminum, copper, cobalt, and mixtures and alloys of such materials, for example. The cell material 128 may be electrically coupled with the electrical contacts 126, and the top electrodes 130 may be electrically coupled with the cell material 128.

The top electrodes 130 may be patterned to isolate digit lines 132 adjacent to each other in the first direction 110 using conventional material removal techniques, such as by photolithographic masking and etching operations, as described above. Openings 134 may be formed to isolate the adjacent digit lines 132. As shown in FIGS. 7A and 7B, the openings 134 may, optionally (depending on the electrical properties of the materials in the structure and the type of memory to be formed), extend into the semiconductor structure to isolate portions of the cell material 128, dielectric structure 106, dielectric liner 108, and dielectric fill material 114. However, in other embodiments (not shown), some portions of the semiconductor structure may not be isolated from adjacent portions or may be isolated further from adjacent portions when compared to the embodiment shown in FIGS. 7A through 7C. For example, some memory types (e.g., oxide-based RRAM) may include an isolation trench only extending into the structure to isolate the digit lines, while the cell material 128 may be left as a bulk material without any isolation between adjacent digit lines. By way of another example, other memory types (e.g., PCM) may include cell material 128 in each memory cell that is isolated from cell material 128 in adjacent memory cells in both the first direction 110 and the second direction 112. Therefore, the present disclosure is not limited by the specific materials and/or configurations of the openings 134, cell material 128, and top electrodes 130.

In some embodiments, the electrical contacts 126 may be used as so-called "heaters" for PCM types. In such embodiments, a state of a PCM cell may be changed by heating an associated electrical contact 126 to cause the cell material 128 of the PCM cell to change phase.

Accordingly, the present disclosure includes methods of forming memory devices including forming bottom electrodes in a dielectric material and forming first liners over the bottom electrodes and the dielectric materials, the first liners extending in a first direction. The methods may also include forming second liners over the first liners, the second liners extending in a second direction transverse to the first direction. The second liners may be removed to form trenches and to expose portions of the first liners. Exposed portions of the first liners may be removed to form pores over the bottom electrodes. Electrical contacts may be structurally and electrically coupled to the bottom electrodes in the pores. A cell material may be formed over and electrically coupled to the electrical contacts. A conductive material may be formed over and electrically coupled to the cell material.

Figure 8:
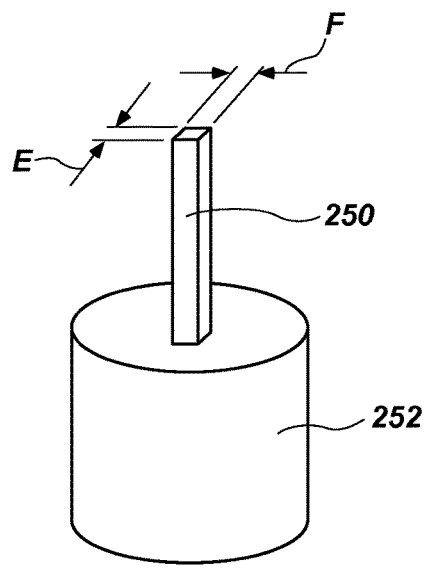
FIG. 8 illustrates a simplified perspective view of an electrical contact formed over an electrical feature according to an embodiment of the present disclosure.

Referring to FIG. 8, an electrical contact 250 of the present disclosure may be structurally and electrically coupled with a conductive feature 252, such as an electrode, a contact pad, a conductive line, etc. Although the conductive feature 252 is shown in FIG. 8 as having a generally circular cross-section, the conductive feature 252 may have any convenient shape, such as rectangular, square, etc. In some embodiments, the conductive feature 252 may be formed by conventional photolithography techniques, and, therefore, may have cross-sectional dimensions at or above conventional photolithographic resolution limits, such as greater than about 20 nm, for example. The electrical contact 250 may have a generally rectangular (e.g., substantially square) cross-section defined by a first width E in a first direction and a second width F in a second direction transverse (e.g., perpendicular) to the first direction. One or both of the first width E and the second width F may have nano-scale values, such as less than about 20 nm each. In some embodiments, one or both of the first width E and the second width F may be less than about 10 nm. In some embodiments, one or both of the first width F and the second width F may be about 2 nm or less. The cross-sectional area of the electrical contact 250 may be less than about 150 nm$^2$, less than about 100 nm$^2$, less than about 50 nm$^2$, or less than about 10 nm$^2$, for example. In some embodiments, the cross-sectional area of the electrical contact 250 may be about 4 nm$^2$. The electrical contact 250 may be formed by the methods described above with reference to FIGS. 1A through 6C.

Accordingly, the present disclosure includes nano-scale electrical contacts comprising a conductive material having a rectangular cross-section comprising a first width in a first direction and a second width in a second direction perpendicular to the first direction. Each of the first width and the second width may be less than about 20 nm. The cross-section may have an area of less than about 150 nm$^2$. In some embodiments, each of the first width and the second width may be about 2 nm or less.

Figure 9:
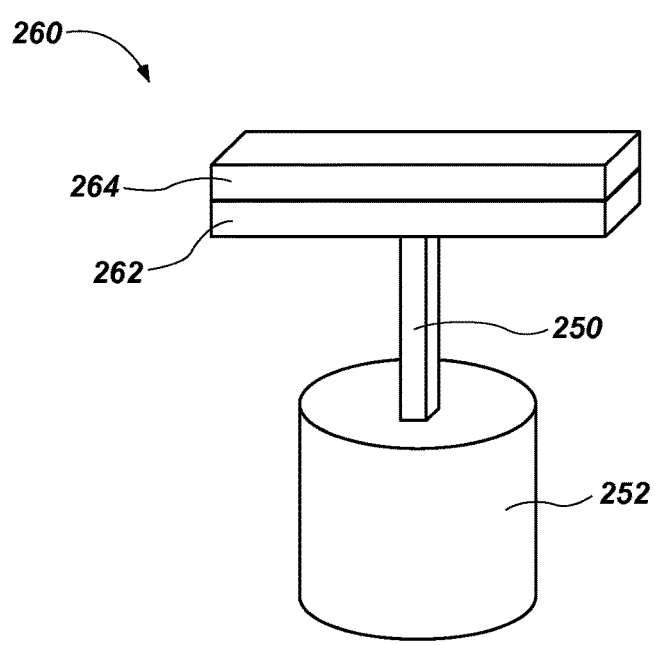
FIG. 9 illustrates a simplified perspective view of a memory device according to an embodiment of the present disclosure including the electrical contact of FIG. 8.

Referring to FIG. 9, a memory device 260 of the present disclosure may include the conductive feature 252 in the form of a bottom electrode and the electrical contact 250, as described above with reference to FIG. 8. The memory device 260 may also include a cell material 262 structurally and electrically coupled to the electrical contact 250 at an end thereof opposite the conductive feature 252, and another conductive feature 264 in the form of a top electrode structurally and electrically coupled to the cell material 262 on a side thereof opposite the electrical contact 250. The memory device 260 may be formed by the methods described above with reference to FIGS. 1A through 7C.

Figure 10:
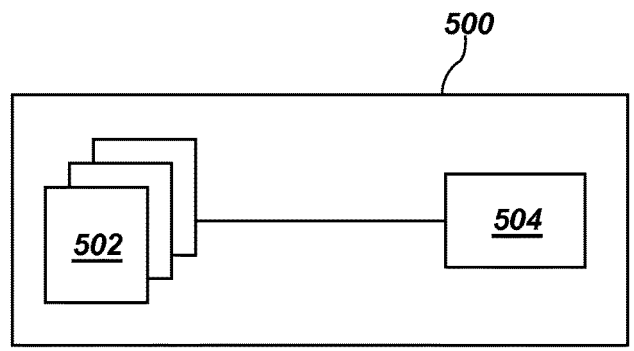
FIG. 10 is a simplified block diagram of a memory device according to an embodiment of the present disclosure.

Referring to FIG. 10, illustrated is a simplified block diagram of a memory device 500 implemented according to one or more embodiments described herein. The memory device 500 includes a memory array 502 and a control logic component 504. The memory array 502 may include a plurality of electrical contacts 126 and/or 250, as described above. The control logic component 504 may be configured to operatively interact with the memory array 502 so as to read, write, or refresh any or all memory cells within the memory array 502 through the electrical contacts 126 and/or 250.

Accordingly, the present disclosure includes a memory device comprising bottom electrodes in a dielectric material with nano-scale electrical contacts over and electrically coupled to respective bottom electrodes. The nano-scale electrical contacts may each comprise a rectangular cross-section having an area less than about 150 nm$^2$. Cell material may be over and electrically coupled to respective nano-scale electrical contacts.

Figure 11:
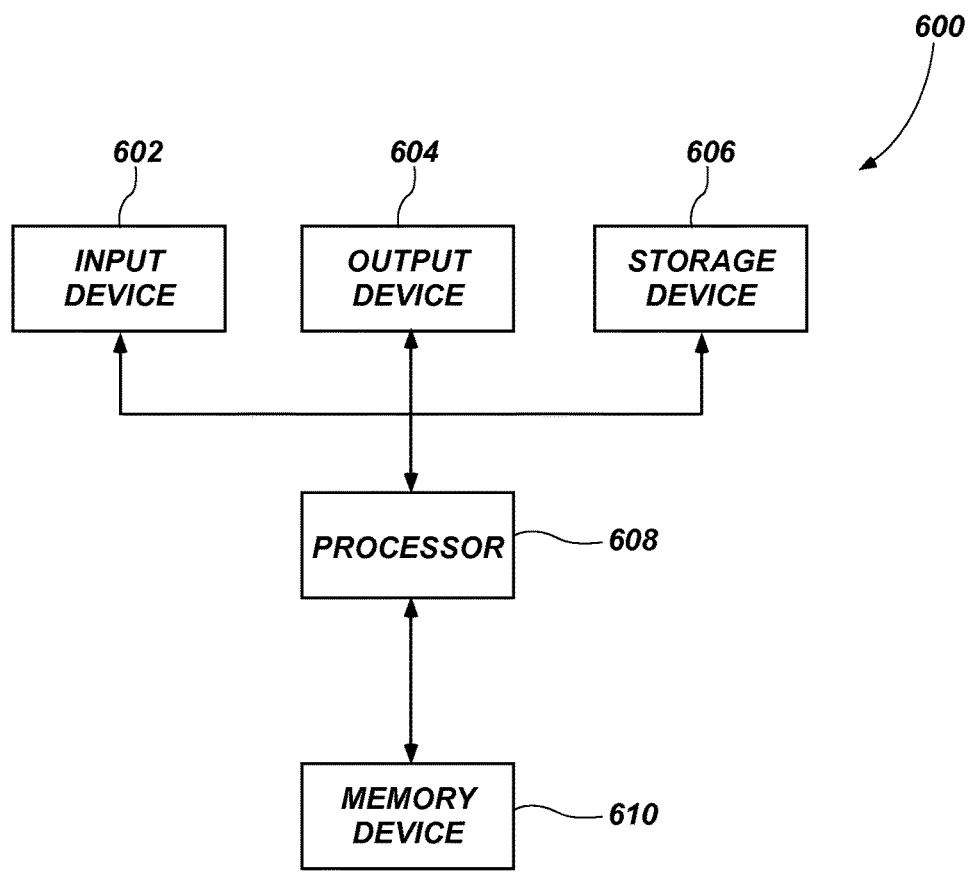
FIG. 11 is a simplified block diagram of a system according to an embodiment of the present disclosure.

With reference to FIG. 11, illustrated is a simplified block diagram of a system 600 implemented according to one or more embodiments described herein. The system 600 includes at least one input device 602. The input device 602 may be a keyboard, a mouse, or a touch screen. The system 600 further includes at least one output device 604. The output device 604 may be a monitor, touch screen, or speaker, for example. The input device 602 and the output device 604 are not necessarily separable from one another. The system 600 further includes a storage device 606. The input device 602, output device 604, and storage device 606 are coupled to a conventional processor 608. The system 600 further includes a memory device 610 coupled to the processor 608. The memory device 610 may include at least one memory array according to one or more embodiments described herein. The system 600 may be incorporated within a computing, processing, industrial, or consumer product. For example, without limitation, the system 600 may be included within a personal computer, a hand-held device, a camera, a phone, a wireless device, a display, a chip set, a game, a vehicle, or another known system.

Accordingly, a system is disclosed comprising a memory array including a plurality of nano-scale electrical contacts. Each nano-scale electrical contact of the plurality of nano-scale electrical contacts may have a substantially rectangular cross-sectional area of less than 150 nm$^2$.

While the present disclosure is susceptible to various modifications and alternative forms, specific embodiments have been shown by way of example in the figures and have been described in detail herein. However, the present disclosure is not intended to be limited to the particular forms disclosed. Rather, the disclosure encompasses all modifications, combinations, equivalents, and alternatives falling within the scope defined by the following appended claims and their legal equivalents.

What is claimed is:

1. A nano-scale electrical contact, comprising:
   a conductive material having a uniform rectangular cross-section along a length thereof, the uniform rectangular cross-section comprising a first width in a first direction and a second width in a second direction perpendicular to the first direction, wherein each of the first width and the second width is less than about 10 nm;
   a first dielectric material adjacent to and in contact with the conductive material; and
   a second dielectric material adjacent to and in contact with the conductive material, the second dielectric material different from the first dielectric material.

2. The nano-scale electrical contact of claim 1, wherein each of the first width and the second width is about 2 nm or less.

3. A memory device, comprising:
   bottom electrodes in a dielectric material;

nano-scale electrical contacts over and electrically coupled to respective bottom electrodes, each of the nano-scale electrical contacts comprising a conductive material having a uniform rectangular cross-section along a length thereof, the uniform rectangular cross-section comprising a first width in a first direction and a second width in a second direction perpendicular to the first direction, wherein each of the first width and the second width is less than about 10 nm;

volumes of a first dielectric material adjacent to and in contact with respective nano-scale electrical contacts; and at least one volume of a second dielectric material adjacent to and in contact with the nano-scale electrical contacts, the second dielectric material different from the first dielectric material; and cell material over and electrically coupled to respective nano-scale electrical contacts.

4. The memory device of claim 3, further comprising top electrodes formed over and electrically coupled to the cell material.

5. The memory device of claim 3, further comprising a substrate comprising a semiconductor material and access devices, wherein the bottom electrodes are formed over the substrate and are electrically coupled to respective access devices of the substrate.

6. The memory device of claim 3, wherein the cell material comprises cell material of a memory type selected from the group consisting of magnetoresistive random-access memory, spin-transfer torque random-access memory, phase change memory, conductive bridge random-access memory and resistive random-access memory.

7. The memory device of claim 3, wherein the cell material is selected from the group consisting of: copper and molybdenum oxide; titanium, praseodymium, calcium, manganese, and oxygen; niobium, strontium-titanium-oxide, and at least one of gold or platinum; strontium oxide, niobium, and strontium-titanium-oxide; iron oxide; tantalum oxide; vanadium oxide; silver, lanthanum, calcium, manganese, and oxygen; copper, chromium, and strontium zirconates; a chalcogenide material; and a perovskite material.

8. The memory device of claim 3, wherein each of the first width and the second width is about 2 nm or less.

9. The memory device of claim 4, wherein the top electrodes comprise digit lines.

10. The memory device of claim 3, wherein the nano-scale electrical contacts comprise heaters and the cell material comprises a phase change cell material.

11. The memory device of claim 3, wherein the nano-scale electrical contacts comprise one or more of tungsten, titanium, aluminum, copper, cobalt, and alloys of tungsten, titanium, aluminum, copper, and cobalt.

12. The nano-scale electrical contact of claim 1, wherein the nano-scale electrical contact comprises a heater for a phase change memory cell material.

13. The nano-scale electrical contact of claim 1, wherein the conductive material is selected from the group consisting of tungsten, titanium, aluminum, copper, cobalt, and alloys of tungsten, titanium, aluminum, copper, and cobalt.

14. The nano-scale electrical contact of claim 1, wherein the conductive material is positioned over and electrically coupled to an electrode of a memory device.

15. The nano-scale electrical contact of claim 1, wherein the nano-scale electrical contact is electrically coupled to a memory cell material.

16. The nano-scale electrical contact of claim 1, wherein lateral sides of the conductive material are surrounded by a dielectric material.

17. A nano-scale electrical contact, comprising:
a conductive material having a rectangular cross-section comprising a first width in a first direction and a second width in a second direction perpendicular to the first direction, wherein each of the first width and the second width is about 2 nm or less;
a first dielectric material adjacent to and in contact with the conductive material; and
a second dielectric material adjacent to and in contact with the conductive material, the second dielectric material exhibiting an etch selectivity with respect to the first dielectric material.

* * * * *

UNITED STATES PATENT AND TRADEMARK OFFICE
CERTIFICATE OF CORRECTION

PATENT NO. : 9,748,474 B2  
APPLICATION NO. : 14/524322  
DATED : August 29, 2017  
INVENTOR(S) : Jun Liu and Kunal R. Parekh Page 1 of 1

It is certified that error appears in the above-identified patent and that said Letters Patent is hereby corrected as shown below:

In the Specification

| | | |
|---|---|---|
| Column 4, | Line 33, | change "FIG. 1A" to --FIGS. 1A-- |
| Column 5, | Line 55, | change "when viewed" to --(when viewed-- |
| Column 6, | Lines 38,39, | change "along the sidewalk" to --along the sidewall-- |
| Column 6, | Line 50, | change "along the sidewalk" to --along the sidewall-- |
| Column 11, | Line 3, | change "'second width of" to --second width D of-- |
| Column 13, | Line 33, | change "first width F" to --first width E-- |

Signed and Sealed this  
Thirty-first Day of October, 2017

Joseph Matal  
*Performing the Functions and Duties of the*  
*Under Secretary of Commerce for Intellectual Property and*  
*Director of the United States Patent and Trademark Office*